United States Patent [19]

Yamauchi

[11] Patent Number: 4,980,303

[45] Date of Patent: Dec. 25, 1990

[54] MANUFACTURING METHOD OF A BI-MIS SEMICONDUCTOR DEVICE

[75] Inventor: Tunenori Yamauchi, Kawasaki, Japan

[73] Assignee: Fujitsu Limited, Kawasaki, Japan

[21] Appl. No.: 233,623

[22] Filed: Aug. 18, 1988

[30] Foreign Application Priority Data

Aug. 19, 1987 [JP] Japan .............................. 62-203984

[51] Int. Cl.$^5$ ........................................... H01L 21/441
[52] U.S. Cl. ....................................... 437/31; 437/41; 437/100; 437/233; 148/DIG. 9; 148/DIG. 72; 148/DIG. 148; 357/43
[58] Field of Search .......................... 437/31, 59, 100

[56] References Cited

U.S. PATENT DOCUMENTS

| | | | |
|---|---|---|---|
| 4,484,388 | 11/1984 | Iwasaki | 437/31 |
| 4,486,942 | 12/1984 | Hirao | 437/59 |
| 4,497,106 | 2/1985 | Mamma | 437/59 |
| 4,757,028 | 7/1988 | Kondoh | 437/100 |
| 4,762,806 | 8/1988 | Suzuki | 437/100 |

OTHER PUBLICATIONS

"A High Current Gain Si HBT with a Hydrogenated Micro-Crystalline Si Emitter" by H. Fujioka et al.: 190, IEDM, 1987.
"Micro-Crystalline Hetero-Emitter with High Injection Efficiency for Si HBT" by K. Sasai et al.: 186, IEDM, 1987.
"Low-Temperature Heteroepitaxy of $\beta$-SiC on Si (111) Substrates" by T. Eshita et al.: Mat. Res. Soc. Symp. Proc., vol. 116, 1988, p. 357.
"Si Heterojunction Bipolar Transistors with Single-Crystalline $\beta$-SiC Emitters" by T. Sugii and T. Ito: J. of the Electrochemical Society, vol. 134, No. 10, Oct., 1987.
"$\beta$-SiC/Si Heterojunction Bipolar Transistors with High Current Gain" by T. Sugii et al.: IEEE Electron Device Letters, vol. 9, No. 2, Feb., 1988.
Kroemer, "Heterostructure Bipolar . . . ", Proceedings of the IEEE, vol. 70, #1, 1/82, pp. 13–25.

*Primary Examiner*—Brian E. Hearn
*Assistant Examiner*—Gordon V. Hugo
*Attorney, Agent, or Firm*—Armstrong, Nikaido, Marmelstein, Kubovcik and Murray

[57] ABSTRACT

With a trend toward higher operation speed and higher gain of a Bi-MIS semiconductor device, wherein a bipolar transistor and a MIS FET are formed on the same silicon substrate, a wide bandgap material such as silicon carbide or micro-crystalline silicon is utilized as an emitter material of the bipolar transistor and further a gate electrode of the MIS FET is simultaneously formed using the same wide bandgap material. By applying the above method in the manufacturing of the Bi-MIS semiconductor device, a high amplification factor of the bipolar transistor and a high cutoff frequency of the MIS FET thereof can be easily obtained without additional processes.

10 Claims, 4 Drawing Sheets

MANUFACTURING METHOD OF A BI-MIS SEMICONDUCTOR DEVICE

BACKGROUND OF THE INVENTION

1. Field of the Invention

This invention relates to a method of manufacturing a Bi-MIS (Bipolar and Metal Insulator Semiconductor) semiconductor device and particularly to a method in which wide-bandgap material is utilized for emitter formation of the bipolar transistor of Bi-MIS semiconductor device. The gate electrode of the MIS FET of the Bi-MIS semiconductor device is simultaneously formed using the same material, resulting in a simplification of the manufacturing processes thereof.

2. Description of the Prior Art

As a structure of Bi-MIS semiconductor devices, a Bi-MOS semiconductor device is widely known, wherein a bipolar transistor and MOS (Metal Oxide Semiconductor) FET are formed on a silicon substrate, a silicon oxide film being utilized as an insulating film for a gate electrode of the MOS FET. The structure and manufacturing method thereof in the prior art are explained below using FIG. 1.

FIG. 1 shows a cross section of a Bi-MOS semiconductor device of the prior art. A p-type silicon substrate 1 is used, and an N+-type buried layer 2 is formed, and next an n-type epitaxial layer 3 is grown thereon. The substrate surface is subjected to thermal oxidization forming a thin silicon oxide film and a silicon nitride layer is deposited by a CVD method (not shown). The silicon nitride layer is removed selectively except on the surface areas for the subsequent transistor forming area. Using the resist layer as a mask, a p+-type isolation region 4 is formed by a boron ion implantation and then a collector pull out region 10 is formed by a phosphorous ion implantation.

A thick field oxide layer 9 is formed on isolation regions 4 by the thermal oxidization method known as LOCOS method. The silicon nitride layer and silicon oxide film on the transistor forming areas are removed and the silicon epitaxial layer 3 is exposed. In FIG. 1, area 5 shows a region where a bipolar transistor is formed in subsequent processes; and area 6, a p-channel MOS FET.

The substrate is subjected to a thermal oxidization, forming a thin silicon oxide film 16 in the transistor forming areas 5 and 6. A resist layer (not shown) is formed on the substrate having an opening for a base layer 7, and a boron ion implantation is performed forming the p-type base layer 7. After removing the above resist layer, the substrate is again covered with a new resist layer (not shown), and an opening for an emitter region is formed in the resist layer, and the silicon surface under the opening is exposed by removing the silicon oxide film 16 therein. The entire surface of the substrate is deposited with polysilicon by a CVD method, and then the polysilicon except in areas for an emitter electrode 21 and a gate electrode 17 is etched away.

A resist layer (not shown) is formed on the substrate and openings for a source and drain regions are formed therein. Again a boron ion implantation is performed, forming a p-type source region 14 and a p-type drain region 15, whereby the resist layer and the gate electrode 17 play a role as a mask for the boron ion implantation, and, therefore, the channel region of the MOS FET can be formed, auto-positioned, i.e., self-aligned with regard to the gate electrode.

A new resist layer (not shown) is formed on the substrate and an opening is formed for the area on the emitter electrode 21. An arsenic or phosphorous ion implantation is carried out. In order to form an n-type emitter layer 8, the emitter electrode 21 of doped polysilicon is then subjected to a heat treatment of about 980° C., resulting in a thermal diffusion of n-type ions into the p-type base layer 7. This thermal treatment also plays a role of annealing or an activating function for source and drain regions 14 and 15, ion-implanted previously.

The entire surface of the substrate is CVD deposited, forming an insulating layer 23 (for example, silicon oxide layer or PSG layer), and contact holes are formed therein. A metal layer such as aluminum alloy is formed thereon, and is patterned, forming a collector electrode 11, an emitter wiring 12, a base electrode 13, a source electrode 19, a drain electrode 20, and a gate wiring 25.

The above fabrication method relating to the Bi-MOS structure of FIG. 1 shown in a schematically simplified form, is just one example among many methods. The method applied in forming the emitter layer 8 is suitable for obtaining a high speed bipolar transistor, wherein doped polysilicon is utilized. In order to manufacture a Bi-CMOS semiconductor device, wherein an n-channel MOS FET is added to the structure of FIG. 1, the processes such as a formation of a p-well in the epitaxial layer 3 and an n-type ion implantation for source and drain regions of the n-channel MOS FET are necessary. Usually, a channel cut is formed under the field oxide layer 9.

Further, an emitter layer 8 may be formed by a direct ion implantation into the base layer 7, however, a more precise control of the emitter region is enabled by the method described above using doped polysilicon for an emitter formation.

With a demand of high speed operation of the Bi-MIS semiconductor device, a higher transition frequency $f_t$ and a larger current amplification factor $h_{FE}$ are required in the bipolar transistor section and further a higher cut off frequency $f_c$ is required in the MIS FET section. The above prior method of using doped polysilicon and forming the emitter layer by thermal diffusion can achieve a more precise control of a pn junction between emitter and base layers than the method of direct As ion implantation into the emitter layer. However, the doped polysilicon method requires a subsequent heat treatment of higher than 950° C. for diffusing the implanted ions into the contacting silicon crystal. This heat treatment has a bad influence on the source and drain regions of MIS FET, which have a high level of impurity doping such as $1 \times 10^{19}/cm^3$ to $1 \times 10^{20}/cm^3$. The source and drain regions spread in a lateral direction resulting in reducing the gate length L, i.e., the distance between source and drain regions, and in making it difficult to control the gate length precisely. The MIS FET is liable to such defects as fluctuation of threshold voltage, punch-through phenomenon, etc. On the other hand, when the source and drain regions are formed after formation of the emitter layer, a subsequent heat treatment for the source and drain regions causes the depth of the emitter layer to vary and makes it difficult to provide a precise value of $f_t$.

In order to obtain a higher transition frequency $f_t$ and a larger current amplification factor $h_{FE}$, another method has been developed in which a wide-bandgap material is used as an emitter material, the emitter being grown on a silicon monocrystal substrate and forming a heterojunction with a base layer in the silicon substrate. Such a transistor is conventionally called a wide-bandgap or wide-gap emitter transistor.

SUMMARY OF THE INVENTION

It is a general object of this invention, therefore, to provide a method for manufacturing a Bi-MIS semiconductor device which shows excellent performance in a high speed operation by a high current amplification factor of the bipolar transistor and a short gate length of MIS FET.

It is a more specific object of the invention to provide a manufacturing method, wherein a wide-gap emitter material is utilized for a bipolar transistor of the Bi-MIS device.

It is another object of the invention to provide a manufacturing method, wherein the emitter and gate electrode of the Bi-MIS device are formed simultaneously using a wide-gap material which can form a heterojunction with a silicon substrate.

It is still another object of the invention to provide a manufacturing method, wherein silicon carbide or micro-crystalline silicon is utilized as the wide-gap emitter material of the Bi-MIS device.

It is a still further object of the invention to provide a manufacturing method, wherein process steps are remarkably simplified.

The foregoing and related objects are accomplished by an application of the heterogeneous growth technology of wide-gap materials on a silicon substrate in forming the emitter and gate electrode of the Bi-MIS device. Especially, silicon carbide can be epitaxially grown on a silicon substrate and its growth temperature has been reduced to as low as about 800° C. from that of 1300° C. of the prior art. Micro-crystalline silicon is also found to be useful for forming the emitter and gate electrode of the Bi-MIS device. Though micro-crystalline silicon does not grow epitaxially on silicon crystal, it can be grown at a very low temperature and has a wide-gap and forms a heterojunction therewith.

Silicon carbide ($\beta$-SiC) has a bandgap of $E_g = 2.2$ eV and micro-crystalline silicon has a bandgap of $E_g = 1.5$ to 1.9 eV. These values are much larger than that of silicon crystal of $E_g = 1.08$ eV. When the above material having a larger bandgap is used for the emitter and forms a heterojunction with silicon base layer, the injection efficiency is made higher and current amplification factor $h_{FE}$ is improved easily without controlling the impurity concentration to a low level in the base layer.

Also, because highly doped silicon carbide $\beta$-SiC can be grown epitaxially on a silicon substrate at a low temperature of about 800° C. and a thermal diffusion process at a temperature higher than 950° C. which has been necessary for the emitter formation by the doped polysilicon method of the prior art, becomes unnecessary, lateral impurity diffusion of the source and drain regions of MIS FET is prevented. This fact makes fabrication of a high speed Bi-MIS device easier. Further, microcrystalline silicon can be grown in a temperature range of 240° C. to 450° C. Therefore, similar effects can be expected for this case.

According to the present invention, because the emitter layer can be formed at a temperature much lower than 950° C., the formation of the emitter layer does not adversely affect the source and drain regions. Further, in the bipolar transistor having a wide-gap emitter according to the present invention, impurity concentration in the base layer can be made higher and, therefore, the base layer resistivity is lowered and the value $f_t$ is made higher. Also, after forming the emitter layer using a material such as $\beta$-SiC, a heat treatment for forming the source and drain regions does not cause adverse effects such as a variation of the width of the base layer.

Other aspects, objects, and the several advantages of the invention will become apparent to one skilled in the art from a reading of the following disclosure and appended claims.

DETAILED DESCRIPTION OF THE PREFERRED EMBODIMENTS

Figure 1:
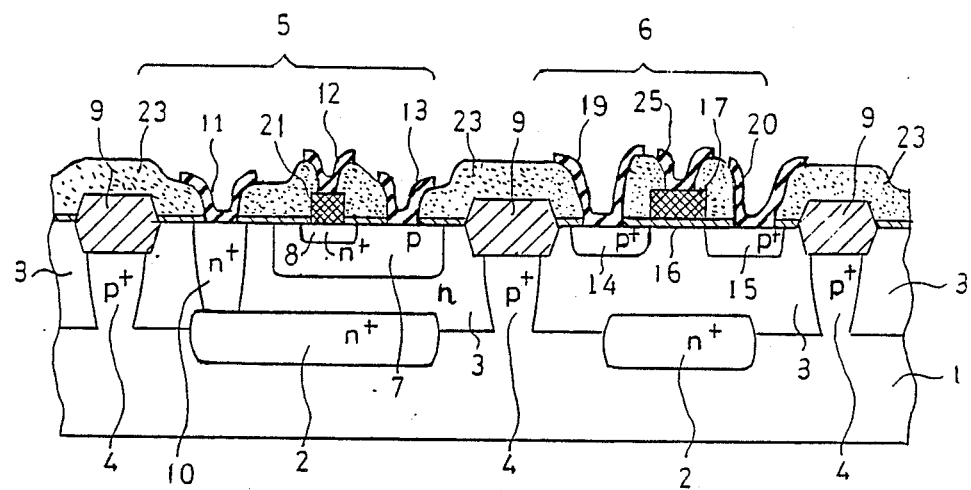
FIG. 1 shows a partial cross sectional view of a Bi-MIS semiconductor device of the prior art, in which the doped polysilicon emitter and doped gate electrode are used.

FIGS. 2-5 each show a cross-sectional view at various steps in the manufacturing process employed to make the Bi-MIS semiconductor device according to the method of the present invention. Same or like reference numerals designate same or corresponding parts throughout the drawings including FIG. 1.

Figure 2:
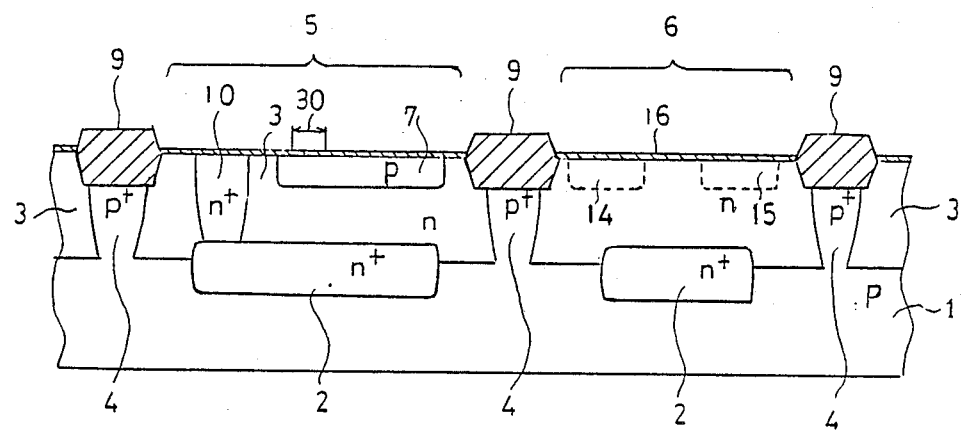
FIGS. 2-5 show cross-sectional views at different sequential steps in the fabrication process employed to manufacture the Bi-MIS semiconductor device in accordance with the principle of the present invention.

The steps for obtaining the structure of FIG. 2 are almost the same as those explained in the prior art. FIG. 2 shows that a silicon substrate (100) 1 is utilized, and a base layer 7 and a collector pull-out layer 10 are formed in a bipolar transistor forming area 5. Further, the substrate surfaces of the bipolar transistor and MIS FET forming areas 5 and 6 are chemically cleaned and exposed, and a new silicon oxide film 16 of about 300 Å thickness is formed by a thermal oxidation process.

Figure 3:
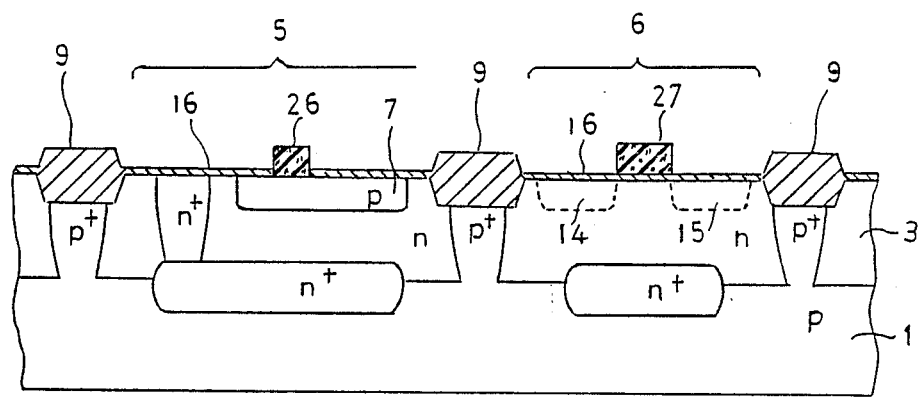

The silicon oxide film 16 in an emitter forming area 30 on base layer 7 of FIG. 2 is removed by a photolithography technique. The entire surface is subjected to a deposition process of an n-type $\beta$-SiC, whereby the deposited $\beta$-SiC on the emitter forming area 30 is grown epitaxially. After forming a resist layer and patterning, the substrate is subjected to a RIE (Reactive Ion Etching) method using a CF$_4$ gas, and most of the deposited n-type $\beta$-SiC is etched away, leaving the emitter 26 and the gate electrode 27 of $\beta$-SiC. This structure is shown in FIG. 3.

With regard to the growing method of $\beta$-SiC, the following references are disclosed and their disclosures are hereby incorporated by reference.

"Si Heterojunction Bipolar Transistors with Single-Crystal $\beta$-SiC Emitters" by T. Sugii, T. Ito: J. of the Electrochemical Society, Vol. 134, No. 10, Oct. 1987.

"B-SiC/Si Heterojunction Bipolar Transistors with High Current Gain" by T. Sugii et al: IEEE Electron Device Letters, Vol. 9, No. 2, Feb. 1988.

"Low-Temperature Heteroepitaxy of $\beta$-SiC on Si (111) Substrates" by T. Eshita et al: '88 MRS Spring Meeting of Heteroepitaxy on Silicon.

In the embodiment of the present invention, C$_2$H$_2$, SiHCl$_3$, and H$_2$ gases are used for epitaxial growth of $\beta$-SiC, thereby the substrate being heated at a temperature of about 800° C. Impurity doping is done by introducing PH$_3$ gas simultaneously during the $\beta$-SiC deposition, which eliminates ion implantation and accompanying annealing processes. AsH$_3$ gas can be also applicable for impurity doping. In the embodiment, an impurity concentration of about $1 \times 10^{20}/cm^3$ is used.

Impurity doping by an ion implantation after the growth of non-doped β-SiC can also be applied. In this case, the thermal annealing process is necessary for the ion implanted emitter. However, in a practical fabrication, the ion implanted emitter is annealed during the subsequent growing process of the insulating layer covering the entire substrate.

Figure 4:
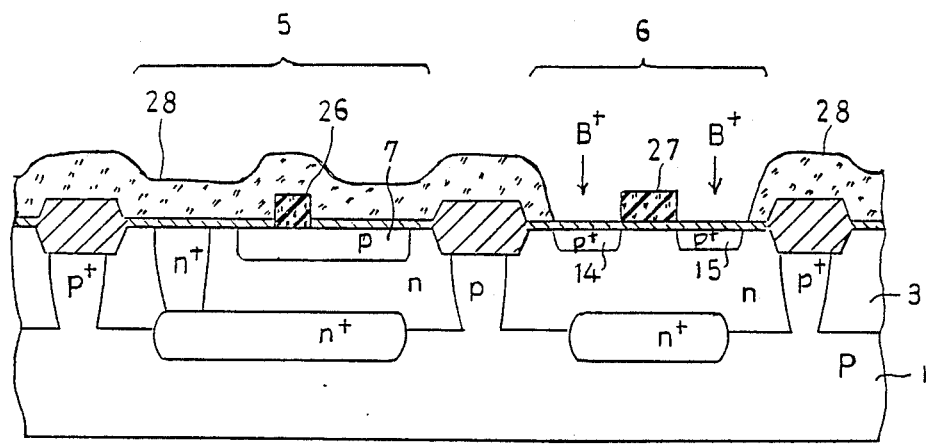

Next, as shown in FIG. 4, source and drain regions 14 and 15 are boron ion implanted using a resist layer 28 covering the entire surface of the substrate except MIS FET area 6. In this process the gate electrode 27 plays the role of a mask. The source and drain regions thus formed have an impurity concentration of $1 \times 10^{19}/cm^3$.

Figure 5:
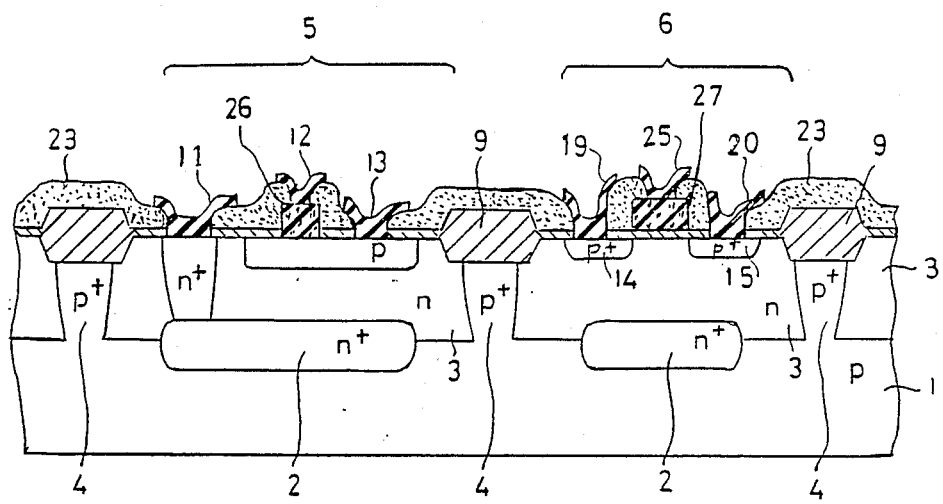

Further, as shown in FIG. 5, an insulating layer 23 is grown on the entire substrate surface. As the insulating layer 23, a BPSG layer is preferable because it can be reflowed and annealed at a temperature of 850° C. which is lower than that of a PSG layer. During this annealing process, the previously ion implanted portions are also annealed and impurity redistribution and activation therein are completed. The above annealing process does not give a bad effect on the pn junction layer between the emitter and base layers and, therefore, a variation of the base layer width can be avoided.

Further, contact holes are formed in the BPSG layer 23, using a conventional photolithography technique, and a metal layer such as an aluminum alloy is deposited on the substrate and patterned by another photolithography technique. Collector electrode 11, emitter wiring 12, base electrode 13, source electrode 19, drain electrode 20, and gate wiring 25 are completed. FIG. 5 shows a cross section of the Bi-MIS semiconductor device completed in this way.

The above embodiment is related to the method of manufacturing the Bi-MIS device using the technology of epitaxial growth of β-SiC forming a heterojunction with silicon crystal. Among materials which can form a heterojunction with silicon crystal, micro-crystalline silicon (μc-Si:H) is known as a material which can be grown at a very low temperature such as 240 to 450° C.

The use of micro-crystalline silicon as an emitter material in a heterojunction bipolar transistor (HBT) is disclosed in the following documents, the disclosure of which is also incorporated herein by reference:

"A High Current Gain Si HBT with A Hydrogenated Micro-Crystalline Si Emitter" by H. Fujioka et al: IEDM, 1987.

"Micro-Crystalline Hetero-Emitter with High Injection Efficiency for Si HBT" by K. Sasaki et al: IEDM 1987.

When the above μc-Si:H is utilized for a formation of the emitter and gate electrode according to the present invention, the annealing temperature after ion implantation for source and drain regions should be lower than the growth temperature of the μc-Si:H. Further, the deposition of BPSG layer 23 at a high temperature in a conventional growth process cannot be used for this case. Therefore, the following processes may be applied. In the step of forming the base layer 7 by ion implantation therein in FIG. 2, the source and drain regions 14 and 15 of MIS FET forming area 6 are simultaneously ion implanted and then annealed. Thus the source and drain regions 14 and 15 are formed as shown by the dashed lines in FIGS. 2 and 3, before the gate electrode 27 is formed. Thereafter, the μc-Si:H layer for the emitter 26 and gate electrode 27 is deposited and patterned. The subsequent deposition process of the insulating layer 23 can be carried out by a plasma CVD method or a photo CVD method at a low temperature.

The above explanation has been given emphasizing the process sequences which are of interest with respect to the present invention, wherein a hetero-material is utilized for an emitter and a gate electrode of a Bi-MIS device. All the processes are conventional for semiconductor manufacturing, hence the details have been omitted and other processes may be applicable. The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A method of manufacturing a Bi-MIS semiconductor device, wherein an isolation structure between adjacent transistor forming areas of a bipolar transistor and a MIS FET, and a collector layer and a base layer in the bipolar transistor forming area are formed in a semiconductor substrate, said method comprising the steps of:

forming an insulating film in said bipolar transistor and MIS FET forming areas on said semiconductor substrate, removing said insulating film and exposing said semiconductor substrate in an area for forming an emitter in a bipolar transistor forming area, depositing and growing a silicon carbide (β-SiC) layer at least on said bipolar transistor and MIS FET forming areas, thereby forming a heterojunction with said substrate surface on said bipolar transistor forming area, said heterojunction being directly formed by said growth of the silicon carbide without an emitter impurity diffusion process, and removing said silicon carbide layer except in said emitter area of the bipolar transistor area and on a channel region of the MIS FET, the emitter and a gate electrode, respectively, of silicon carbide thereby being retained.

2. A method of manufacturing a Bi-MIS semiconductor device according to claim 1, wherein said semiconductor substrate is silicon.

3. A method of manufacturing a Bi-MIS semiconductor device according to claim 1, wherein said depositing and growing step of silicon carbide is performed while maintaining a substrate temperature lower than 850° C.

4. A method of manufacturing a Bi-MIS semiconductor device according to claim 3, said manufacturing method further comprising a step of:

ion implanting source and drain regions of the MIS FET after the formation of the gate electrode which gate electrode is used as a mask on the channel region, the source and drain regions thereby being formed in self-alignment with the grate electrode.

5. A method of manufacturing a Bi-MIS semiconductor device according to claim 4, said manufacturing method further comprising a step of:

subjecting said substrate to a temperature lower than said depositing and growing temperature of the silicon carbide after the ion implantation step, said ion implanted source and drain regions thereby being annealed.

6. A method of manufacturing a Bi-MIS semiconductor device according to claim 5, wherein said step of subjecting the substrate to the specified temperature is done simultaneously in a subsequent forming step of an insulating layer covering the entire surface.

7. A method of manufacturing a Bi-MIS semiconductor device according to claim 3, wherein said depositing and growing step of micro-crystalline silicon is performed with a substrate temperature between 240° C. to 450° C.

8. A method of manufacturing a Bi-MIS semiconductor device according to claim 9, said manufacturing method further comprising a step of:
 ion implanting source and drain regions of the MIS FET and annealing said regions before said depositing and growing steps of said micro-crystalline silicon.

9. A method of manufacturing a Bi-MIS semiconductor device according to claim 7, wherein all subsequent processes after said depositing and growing step of micro-crystalline silicon are performed at a temperature not higher than said depositing and growing temperature.

10. A method of manufacturing a Bi-MIS semiconductor device, wherein an isolation structure between adjacent transistor forming areas of a bipolar transistor and a MIS FET, and a collector layer and a base layer in the bipolar transistor forming area are formed in a semiconductor substrate, said method comprising the steps of:
 forming an insulating film in said bipolar transistor and MIS FET forming areas on said semiconductor substrate,
 removing said insulating film and exposing said semiconductor substrate in an area for forming an emitter in a bipolar transistor forming area,
 depositing and growing a micro-crystalline silicon ($\mu$c-Si:H) layer at least on said bipolar transistor and MIS FET forming areas, thereby forming a heterojunction with said substrate surface on said bipolar transistor forming area, said heterojunction being directly formed by said growth of the micro-crystalline silicon without an emitter impurity diffusion process, and
 removing said micro-crystalline silicon layer except in said emitter area of the bipolar transistor area and on a channel region of the MIS FET, the emitter and a gate electrode, respectively, of micro-crystalline silicon thereby being retained.

* * * * *